United States Patent
Roozeboom et al.

(10) Patent No.: US 9,667,253 B2
(45) Date of Patent: May 30, 2017

(54) INPUT PIN STATE DETECTION CIRCUIT AND METHOD THEREFOR

(71) Applicant: NXP B.V., Eindhoven (NL)

(72) Inventors: Dominicus Marinus Roozeboom, Milpitas, CA (US); Sharad Murari, Tempe, AZ (US); Harold Garth Hanson, Sunnyvale, CA (US)

(73) Assignee: NXP B.V., Eindhoven (NL)

( * ) Notice: Subject to any disclaimer, the term of this patent is extended or adjusted under 35 U.S.C. 154(b) by 40 days.

(21) Appl. No.: 14/677,658

(22) Filed: Apr. 2, 2015

(65) Prior Publication Data

US 2015/0214948 A1 Jul. 30, 2015

Related U.S. Application Data

(63) Continuation of application No. 12/790,362, filed on May 28, 2010, now Pat. No. 9,000,808.

(51) Int. Cl.
| | |
|---|---|
| *H01L 25/00* | (2006.01) |
| *H03K 19/0175* | (2006.01) |
| *H03M 1/36* | (2006.01) |
| *H03K 5/24* | (2006.01) |
| *H03K 19/173* | (2006.01) |

(52) U.S. Cl.
CPC ....... *H03K 19/017581* (2013.01); *H03K 5/24* (2013.01); *H03K 19/173* (2013.01); *H03M 1/365* (2013.01)

(58) Field of Classification Search
CPC . H03K 19/017581; H03K 19/173; H03K 5/24
USPC ................... 327/74–76; 326/37–38
See application file for complete search history.

(56) References Cited

U.S. PATENT DOCUMENTS

| | | | |
|---|---|---|---|
| 6,477,205 B1 | 11/2002 | Doblar et al. | |
| 6,611,222 B1 | 8/2003 | Murphy | |
| 7,061,421 B1 | 6/2006 | Xiao | |
| 7,138,824 B1 | 11/2006 | Bakker et al. | |
| 7,138,842 B2 | 11/2006 | Padhye et al. | |
| 7,245,148 B2 | 7/2007 | Awalt et al. | |
| 7,486,106 B1 | 2/2009 | Camarota | |
| 8,045,353 B2 | 10/2011 | Bansal | |
| 8,129,969 B1 | 3/2012 | Chui et al. | |
| 8,674,726 B2 | 3/2014 | Murari | |
| 9,000,808 B2 * | 4/2015 | Roozeboom | H03M 1/365 326/37 |

FOREIGN PATENT DOCUMENTS

| | | | |
|---|---|---|---|
| JP | 61066590 A | 4/1986 | |
| JP | 8190963 A | 7/1996 | |

OTHER PUBLICATIONS

Extended European Search Report, Oct. 6, 2011, EPO.

* cited by examiner

*Primary Examiner* — Kenneth B Wells

(57) ABSTRACT

A state-detection circuit facilitates the detection of the state of an input pin relative to several different types of input circuits. According to an example embodiment, a state-detection circuit includes a plurality of comparators and circuit components, configured to provide a plurality of binary output signals that collectively indicate a state of an input pin to which the comparators are coupled. The state-detection circuit is configured to facilitate the detection of several different types of input circuits, based upon the binary output signals.

19 Claims, 9 Drawing Sheets

INPUT PIN STATE DETECTION CIRCUIT AND METHOD THEREFOR

CROSS-REFERENCE TO RELATED APPLICATIONS

This application claims the priority under 35 U.S.C. 119(e) or 120, and 37 CFR 1.78 as a continuation of U.S. patent application Ser. No. 12/790,362, filed May 28, 2010 and now issued as U.S. Pat. No. 9,000,808, the contents of which are incorporated by reference herein.

Many early electronic circuits and related systems incorporated two or more levels of logic, some with complete variability, using analog inputs and outputs. As digital systems were introduced and increased in capability (e.g., storage, speed, input/output capabilities), binary inputs and outputs were used. Modern system communications have since evolved to using digital signals, including static configuration and other static information signals.

In many applications, circuits desirably operate using different types of inputs, and under different operational conditions. For such circuits, it has often been necessary to use redundant components, such as input pins, for connecting to different types of input circuits.

In many circuit applications, compact size and efficiency are highly desirable. For example, as relative to many applications including those involving programmable circuits requiring or benefitting from operation with different types of input circuits, it is often desirable to package circuits in small areas for implementation with relatively compact devices. In addition, reducing the required size of circuits can be helpful for cost reduction.

Many circuits are not readily amenable to compact arrangements and efficient manufacture and operation. For example, many circuits are desirably applicable for implementation with a wide variety of different types of devices. To do so, such circuits must be configurable for specific operational characteristics. Unfortunately, this configurability can introduce added complexity and cost to the circuits.

These challenges can make it difficult to achieve desirable circuit and package sizes while also ensuring proper circuit operation.

In connection with various example embodiments, an input circuit facilitates various configurations, in a manner that addresses challenges for a variety of applications and devices, such as those discussed above.

In connection with an example embodiment, an input state detection circuit includes an input pin configured for receiving signals generated by a plurality of different types of input circuits, and a state-detection circuit configured to provide an output characterizing the state of the input pin for a plurality of input states respectively corresponding to the different types of input circuits. The state-detection circuit includes a plurality of comparators respectively having their high-level inputs directly coupled to the input pin, having their low-level inputs coupled between a power source and a ground node, and configured to provide a binary output that, when collectively processed with the binary outputs of the other comparators, indicates the state of the input pin. A resistor circuit is connected in series between a first one of the comparators and the power source. Resistor circuits are also coupled between each pair of comparators having input pins connected in series, and another resistor circuit is connected between a last one of the comparators and the ground node. A negative-feedback operational amplifier has an output connected to the high-level input of the comparators, a high-level input, a low-level input and a feedback circuit connecting the output to the low-level input. A resistor circuit is connected between the high-level input of the negative-feedback operational amplifier and a feedback power source. Another resistor circuit is connected between the high-level input of the negative-feedback operational amplifier and a feedback ground node.

Another example embodiment is directed to a configurable input circuit for operating in accordance with a plurality of different input circuits. The input circuit includes an input pin to receive an input signal, a state-detection circuit, a decoder circuit and a control circuit. The state-detection circuit is configured to, upon start-up of the configurable input circuit, provide a binary output signal for determining a state characteristic of the input signal, the state detection circuit having an output that provides at least N-1 output values that make up the binary output signal, the output signal being responsive to the state of the input pin and exclusive for each of N different types of input circuits. The decoder circuit is configured to decode the binary output to determine the state of the input pin and a type of input circuit corresponding to the determined state. The control circuit is configured to power-on the state-detection circuit upon startup of the configurable input circuit, to power-off the state-detection circuit in response to the decoder circuit determining the state of the input signal, and to configure the input circuit for operation based upon the determined state of the input pin.

Another example embodiment is directed to a method for operating an input circuit. An input signal is received at an input pin, and in response to a startup condition, a state-detection circuit is powered to provide a binary output signal for determining a state characteristic of the input signal. The state detection circuit is used to provide an output having at least N-1 output values that make up the binary output signal, the output signal being responsive to the state of the input pin and exclusive for each of N different types of input circuits. In a decoder circuit, the binary output is decoded to determine the state of the input pin and a type of input circuit corresponding to the determined state. In response to determining the state of the input signal, the state-detection circuit is powered off The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which.

Figure 1:
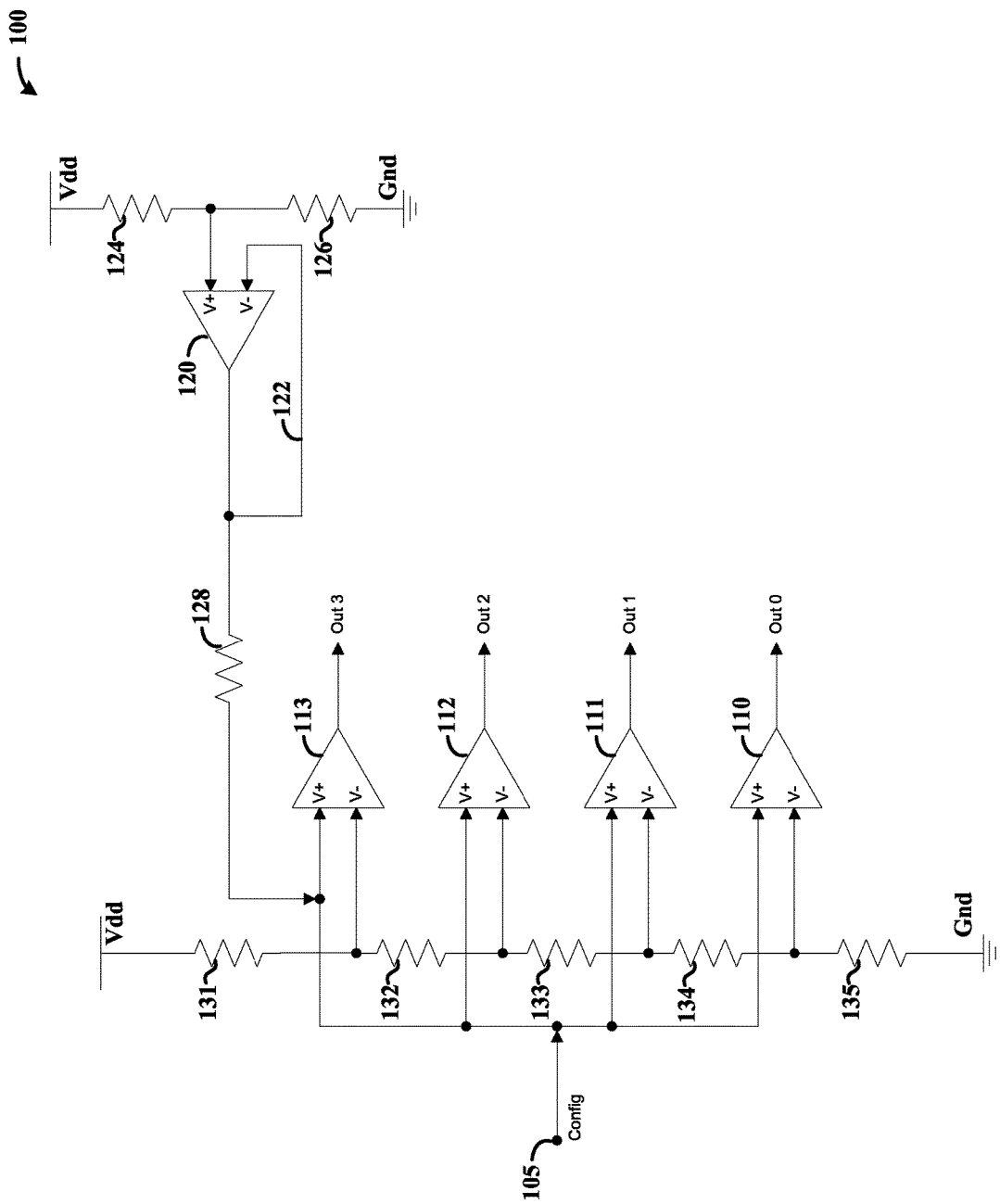
FIG. 1 shows a quinary input circuit, in accordance with an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined in the claims.

The present invention is believed to be applicable to a variety of different types of input circuits, programmable chips, devices and related arrangements. While the present invention is not necessarily so limited, various aspects of the invention may be appreciated through a discussion of examples using this context.

In connection with various example embodiments, a binary-type input pin state circuit is configured to generate a plurality of different output values based upon an input signal as received at a single input pin. The input state circuit includes a set of comparators configured and connected to generate the output values as an indication of the configuration of an input circuit via which the input signal is presented.

The combination of output values facilitates the detection of several (e.g., 3, 5 or more) different types of input circuits, by providing different and distinct combinations of output values for input signals received from each type of input circuit. The connectivity of the comparators and related circuitry (e.g., a resistor tree divider) can be set based upon the desired number of different types of input circuits to be detected. In different embodiments, combinations of resistors, shorts, ties to a reference/supply voltage (e.g., Vdd) or to ground are used with the comparators to set the combination of outputs from the respective comparators for use in detecting the type of input circuit.

The output states of the respective comparators can be used to set the configuration of one or more circuits that use the input circuit (and signals presented via the input circuit) for subsequent processing. For example, where an input pin can be connected to a variety of different types of input circuits, the signal presented at the input pin is processed via the input state circuit, which generates output values (e.g., a series of high and low values corresponding to logical ones or zeros). The combination of output values can be used together with a known configuration of the input state circuit and its comparators, or simply using a lookup table, to detect a type of the input circuit.

Input circuits detectable using this approach may include, for example, circuits presenting a short to ground, resistor to ground, open, resistor to reference voltage, and short to a reference voltage, combinations thereof, or other circuits. Once the type of input circuit is detected, the resulting detection can be used in operation of the input circuit for subsequent processing.

These approaches can further be used iteratively for a particular circuit, to detect the type of several different input circuits for a particular device. In some instances, several input state circuits are used to detect the state of various input pins, and the corresponding type of input circuit present at the respective pins. In other instances, an input state circuit is used to detect the type of input circuit present at different input pins, and a switch-type circuit is used to selectively connect different input circuits to the input state circuit, with the outputs from the input state circuits respectively provided and used to detect/set the state of the respective input pins.

The input state circuit can be used to provide an indication of the type of input circuit connected to the input state circuit at various stages of operation and under differing conditions, depending upon the application. In some implementations, the input state circuit is powered upon startup of an input circuit, used to detect the type of the input circuit, and then powered down to conserve energy as the input circuit is subsequently used for processing.

In other implementations, the input state circuit is powered upon an initial startup of the input circuit, used to generate output values for detecting the type of the input circuit connected to an input pin of the input state circuit, then powered down until an event or condition is satisfied. The detected type of the input circuit is stored or otherwise preserved such that the type is known and used over time. With this approach, the type of the input circuit can be set and used over various shut-down and start-up cycles or long periods of operation. When a condition such as a reset condition is encountered, the input state circuit is powered again and used to re-generate the plurality of output values from a new input signal, using the comparators. Once the new input signal is processed for detecting the type of input circuit providing the signal, the input state circuit is again powered down.

In the above-discussed exemplary embodiments, the input state circuit can be powered in various contexts. In many implementations, the input state circuit is generally passive, and operates based upon sampling of a signal at the input pin. Accordingly, powering the input state circuit off may involve simply disconnecting the circuit from the input pin and/or Vdd as appropriate.

The input state circuit can be used in a variety of different types of circuits. For example, the input state circuit can be used as a stand-alone circuit, as an add-on type of circuit, or integrated with other circuits. Accordingly, the input state circuit may include one or more additional circuits as appropriate to suit various applications.

Other example embodiments are directed to a decoder circuit including an input state circuit such as described above, as well as a decoder circuit that decodes the outputs of the input state circuit and provides an output that is used to facilitate the operation of circuitry using the input circuit. In some instances, the decoder circuit defines the type of the input circuit connected to the input state circuit and provides an output that can be interpreted for identifying the type of the input circuit. In other instances, the decoder circuit generates an output or outputs that set or sets certain operational characteristics of a circuit connected to the input circuit, based upon the detected type of input circuit (e.g., a series of switches or other connections can be controlled, based upon the decoded signal and corresponding detected type of the input circuit).

Still other embodiments are directed to integrated circuits having a plurality of circuits and devices, including an input state circuit (such as described above) that is configured and connected to provide outputs for detecting a type of input circuit connected to a single input pin, a decoder circuit for decoding the outputs, and circuitry that operates with the input circuit. Such circuits may include, for example, those used in integrated circuit chips, mixed-signal circuits, computers and mobile devices. The output of the decoder is used in configuring the integrated circuit based upon the type of input circuit connected to the input pin.

As discussed above, a variety of different types and combinations of input circuits can be detected using an input state detection such as described herein, with comparators connected using different combinations of circuits (e.g., resistors, shorts and connectivity to Vdd and ground) to provide an appropriate combination of outputs based upon characteristics of the input circuit connected to the input pin. The following discussion of FIG. 1 and the exemplary outputs and corresponding input pin state (and corresponding input circuit type) are applicable for use with a quinary input circuit by way of example. However, these approaches are applicable to implementation with a variety of example embodiments, in different configurations, to provide binary outputs to characterize the state of an input pin and a corresponding type (of several types) of an input circuit connected thereto.

Turning to FIG. 1, a quinary input state detection circuit 100 is configured to provide binary outputs to characterize a type of input circuit connected to an input pin 105, in accordance with another example embodiment of the present invention. The state detection circuit 100 includes a plurality of comparators including comparators 110-113 that respectively provide binary outputs 0-3, which collectively provide an indication of the state of the input pin 105 via the signal received thereat. This state corresponds to a type of input circuit coupled to the input pin 105.

The input pin 105 is connected to the high voltage (V+) input terminals of the comparators 110-113, as well as to the output of a negative-feedback operational amplifier 120 and its low (V−) input terminals via feedback loop 122. The high input terminal of operational amplifier 120 is coupled to Vdd via resistor circuit 124, and the low input terminal of operational amplifier 120 is coupled to ground via resistor circuit 126.

The low input terminals of comparators 110-113 are coupled between Vdd and ground, with resistor circuits between the connections. Specifically, resistor circuit 131 is coupled between Vdd and the low input terminal of comparator 113, resistor circuit 132 is coupled between the low input terminals of comparators 113 and 112, resistor circuit 133 is coupled between the low input terminals of comparators 112 and 111, resistor circuit 134 is coupled between the low input terminals of comparators 111 and 110, and resistor circuit 135 is coupled between the low input terminal of comparator 110 and ground.

The input state detection circuit 100 accordingly provides binary outputs (e.g., bits) at each of outputs 0-3, at comparators 110-113, to indicate a type of input circuit coupled to the input pin 105. In connection with various embodiments, the input state detection circuit 100 is connected and operated to provide outputs as shown in the Quinary Input Truth Table of Table 1. The input state in Table 1 represents the connectivity of the input pin 105, relative to a type of circuit connected thereto. Each of the outputs 0-3 is reflective of the corresponding binary output values of each of the comparators 110-113.

TABLE 1

Quinary Input Truth Table

| Input State | Out<3> | Out<2> | Out<1> | Out<0> | State |
|---|---|---|---|---|---|
| Short to Ground | 0 | 0 | 0 | 0 | 1 |
| R to Ground | 0 | 0 | 0 | 1 | 2 |
| Open | 0 | 0 | 1 | 1 | 3 |
| R to Vdd | 0 | 1 | 1 | 1 | 4 |
| Short to Vdd | 1 | 1 | 1 | 1 | 5 |

The indicated state in Table 1 is exemplary with this state being named or otherwise characterized to facilitate the particular application in which the input state detection circuit is implemented. Here, the connection of the input pin 105 via short to ground is indicated as state 1; the connection of the input pin 105 via a resistor to ground is indicated as state 2; the connection of the input pin 105 to an open circuit is indicated as state 3; the connection of the input pin 105 via a resistor to Vdd is indicated as state 4; and the connection of the input pin 105 via short to Vdd is indicated as state 5. In addition, by detecting the values at respective outputs in sequential combinations of resistors (e.g., starting with output 3), detecting a value of "1" at a particular output can be used to discern that the remaining outputs (in descending order) also have a value of "1."

In connection with many example embodiments, the input state detection circuit 100 may further include or otherwise provide an output indicative of the state of the pin 105 as shown in Table 1. For example, a decoder circuit can be implemented with or as part of the input state detection circuit 100, and used to generate an output indicative of the state number as shown. Similarly, a decoder circuit can also be implemented to generate an output that configures one or more circuits using the input circuit coupled to the input pin 105 under operational conditions.

Various configurations can be achieved using different numbers of input pins. For example, Table 2 shows a number of input pins used to achieve different configurations, relative to the number of states:

TABLE 2

Pin Configuration

| No. of Configurations | Number of Pins | | | |
|---|---|---|---|---|
| | 2 states/pin | 5 states/pin | 10 states/pin | 16 states/pin |
| 10 | 4 | 2 | 1 | 1 |
| 125 | 7 | 3 | 3 | 2 |
| 625 | 10 | 4 | 3 | 3 |
| 3125 | 12 | 5 | 4 | 3 |

These respective configurations can be implemented with the circuits shown in the Figures, such as with FIG. 1, and various modifications to include additional (e.g., comparable) circuits to provide two or more input pins and related comparators to facilitate additional states and configurations (e.g., in detecting five states with a single pin, 25 configurations are programmable with two pins).

FIGS. 2-6 show example input circuits that may be implemented in connection with the example embodiments described herein, including those shown in and described in connection with FIG. 1. For example, the input chips shown in each respective figure may be implemented using an input state detection circuit as shown in FIG. 1, or a combination of such circuits with additional circuitry, such as for decoding the binary outputs or operating with the input circuits.

Figure 2:
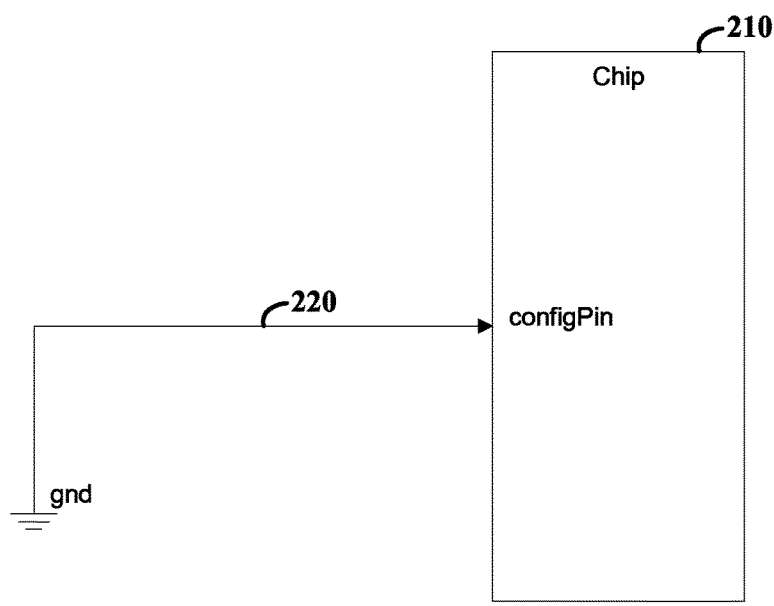
FIG. 2 shows an input pin circuit arrangement having an input connection to ground, according to another example embodiment of the present invention.

Beginning with FIG. 2, an input pin circuit arrangement 200 includes a chip 210 and an input circuit 220 connected to ground, in connection with another example embodiment of the present invention. When used with the input state detection circuit 100 of FIG. 1, the input circuit 220 connects the input pin 105 to ground, and thus effectively couples the input pins of the respective comparators 110-113 (as well as the output of operational amplifier 120, via resistor 128) to ground, setting the outputs of the comparators 110-113 to zero as shown in Table 1 for state 1.

Figure 3:
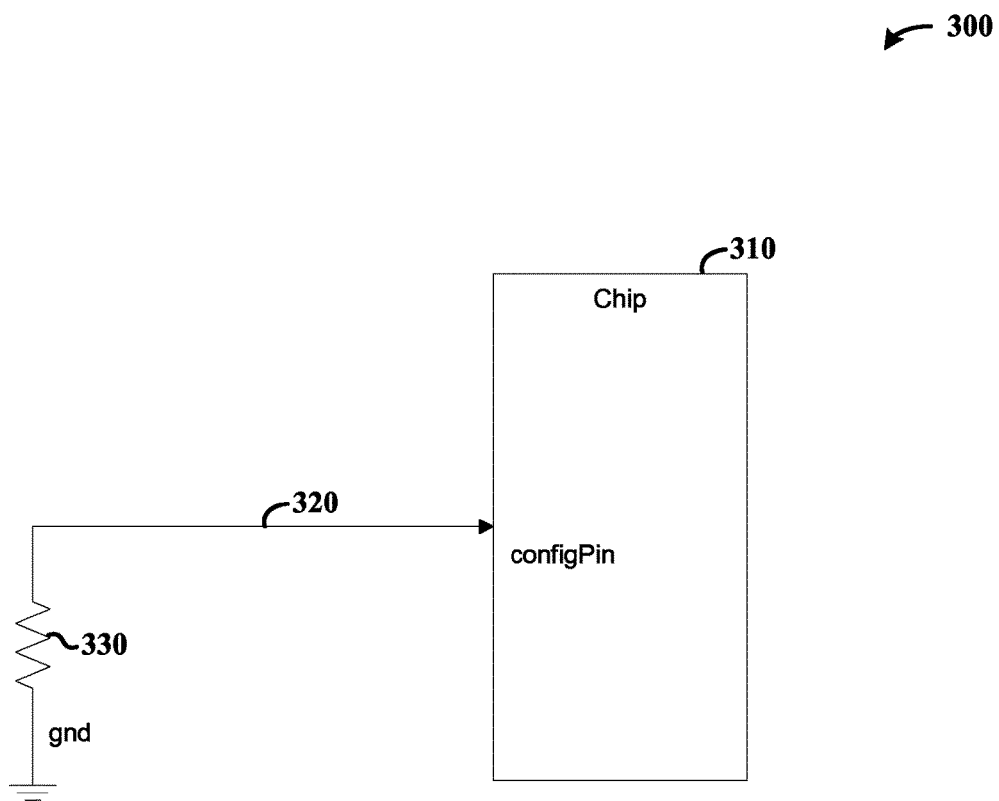
FIG. 3 shows an input pin circuit arrangement having an input connection to ground through a resistor, according to another example embodiment of the present invention.

FIG. 3 shows an input pin circuit arrangement 300 including a chip 310 and an input circuit 320 connected to ground through a resistor 330, according to another example embodiment of the present invention. When connected to input 105 of the input state detection circuit 100 (as part or all of chip 310), the input circuit 320 connects the respective high level inputs of the comparators 110-113 (as well as the output of operational amplifier 120) to ground via the resistor 330. The outputs of comparators 111-113 are correspondingly set to zero, and the output of comparator 113 is set to 1, as shown in Table 1 for state 2.

Figure 4:
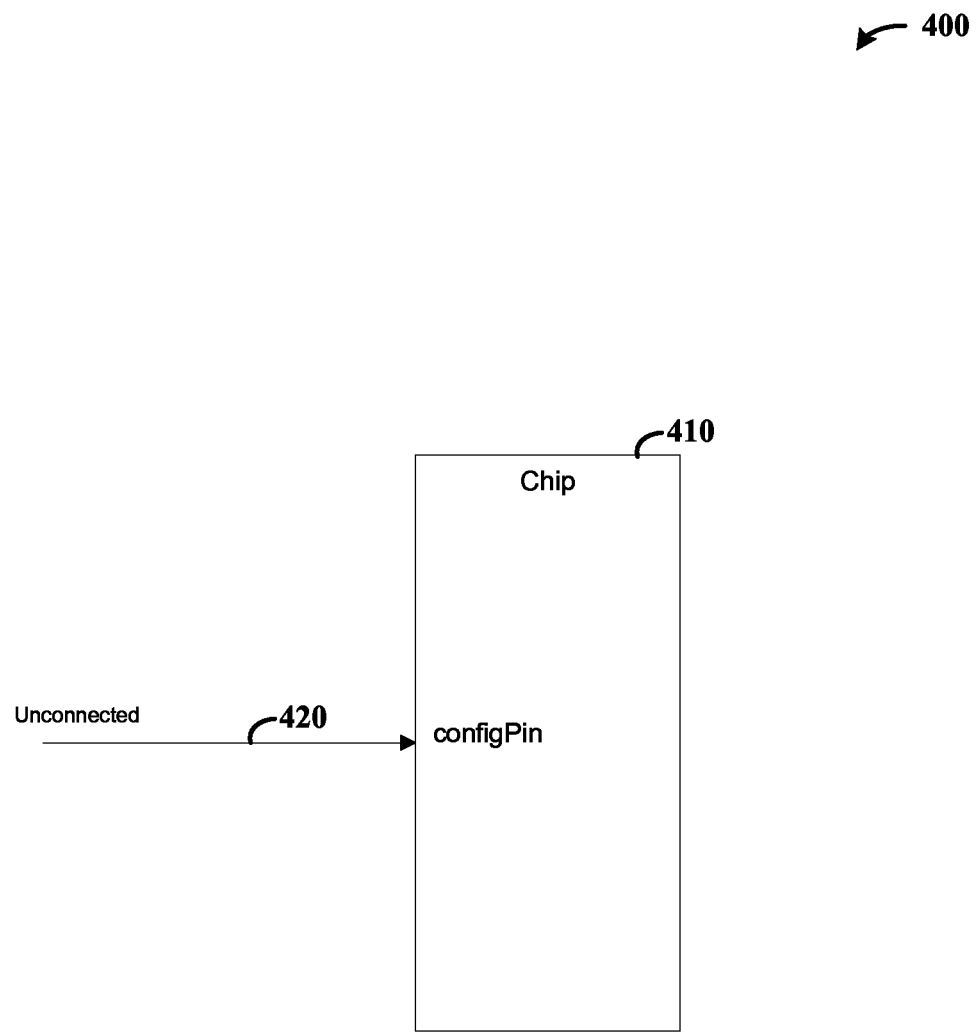
FIG. 4 shows an input pin circuit arrangement having an input connection to an open circuit, according to another example embodiment of the present invention.

FIG. 4 shows an input pin circuit arrangement 400 including a chip 410 and an input circuit 420 that is an open circuit, according to another example embodiment of the present invention. When connected to input 105 of the input state detection circuit 100 (as part or all of chip 410), the input circuit 420 connects the respective high level inputs of the comparators 110-113 to an open circuit, resulting in the input connectivity of the respective comparators being tied to the output of operational amplifier 120. The outputs of comparators 110-113 are correspondingly set as shown for respective outputs 0-3 in Table 1 for state 3.

Figure 5:
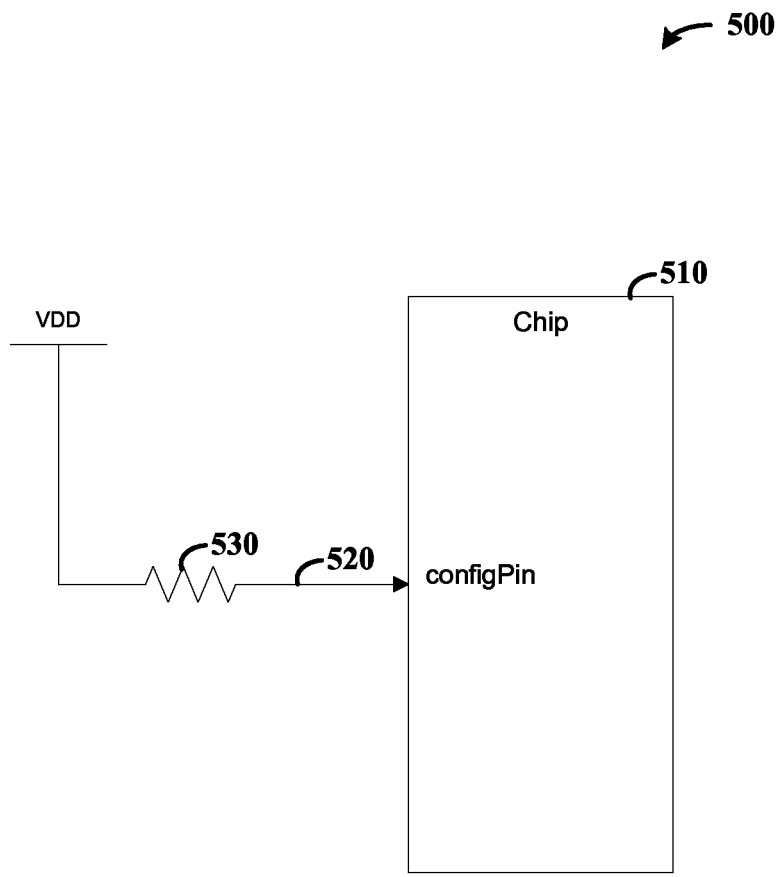
FIG. 5 shows an input pin circuit arrangement having an input connection to VDD through a resistor, according to another example embodiment of the present invention.

FIG. 5 shows an input pin circuit arrangement 500 including a chip 510 and an input circuit 520 connected to VDD through a resistor 530, according to another example embodiment of the present invention. When connected to input 105 of the input state detection circuit 100 (as part or all of chip 510), the input circuit 520 connects the respective high level inputs of the comparators 110-113 to Vdd via resistor 530. The outputs of comparators 110-113 are correspondingly set as shown for respective outputs 0-3 in Table 1 for state 4.

Figure 6:
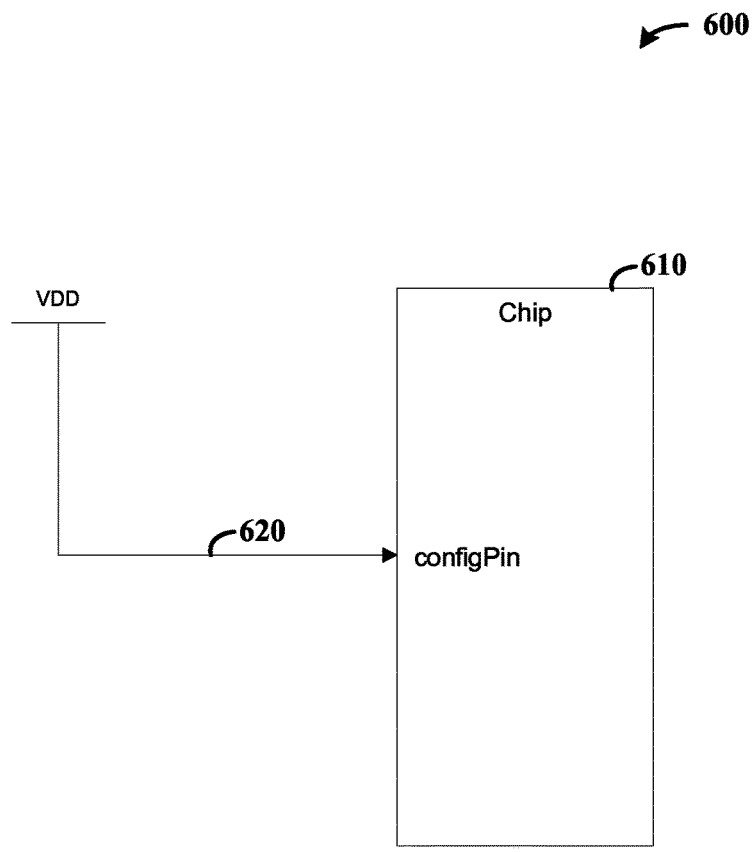
FIG. 6 shows an input pin circuit arrangement having an input connection to VDD, according to another example embodiment of the present invention.

FIG. 6 shows an input pin circuit arrangement 600 including a chip 610 and an input circuit 620 connected to VDD, according to another example embodiment of the present invention. When connected to input 105 of the input state detection circuit 100 (as part or all of chip 610), the input circuit 620 connects the respective high level inputs of the comparators 110-113 directly to Vdd. The outputs of comparators 110-113 are correspondingly set as shown for respective outputs 0-3 in Table 1 for state 5.

As relevant to the embodiments shown in FIGS. 1-6, the values of the resistors in the circuit shown in FIG. 1, can be set relative to the expected types of circuits to be detected at the input pin 105. For example, the resistor tree structure as shown can be configured to detect connection to Vdd or ground, respectively relative to such connection as made via a short or resistor, the presence of a resistor in the circuit. Accordingly, the respective values of the resistors in the circuit 100 may be set based upon an expected use as may relate to a type of resistor, power supply and/or other condition, to facilitate a binary output (e.g., as in Table 1) that represents the detection of both ground and Vdd connectivity with and without a resistor in the circuit.

Figure 7:
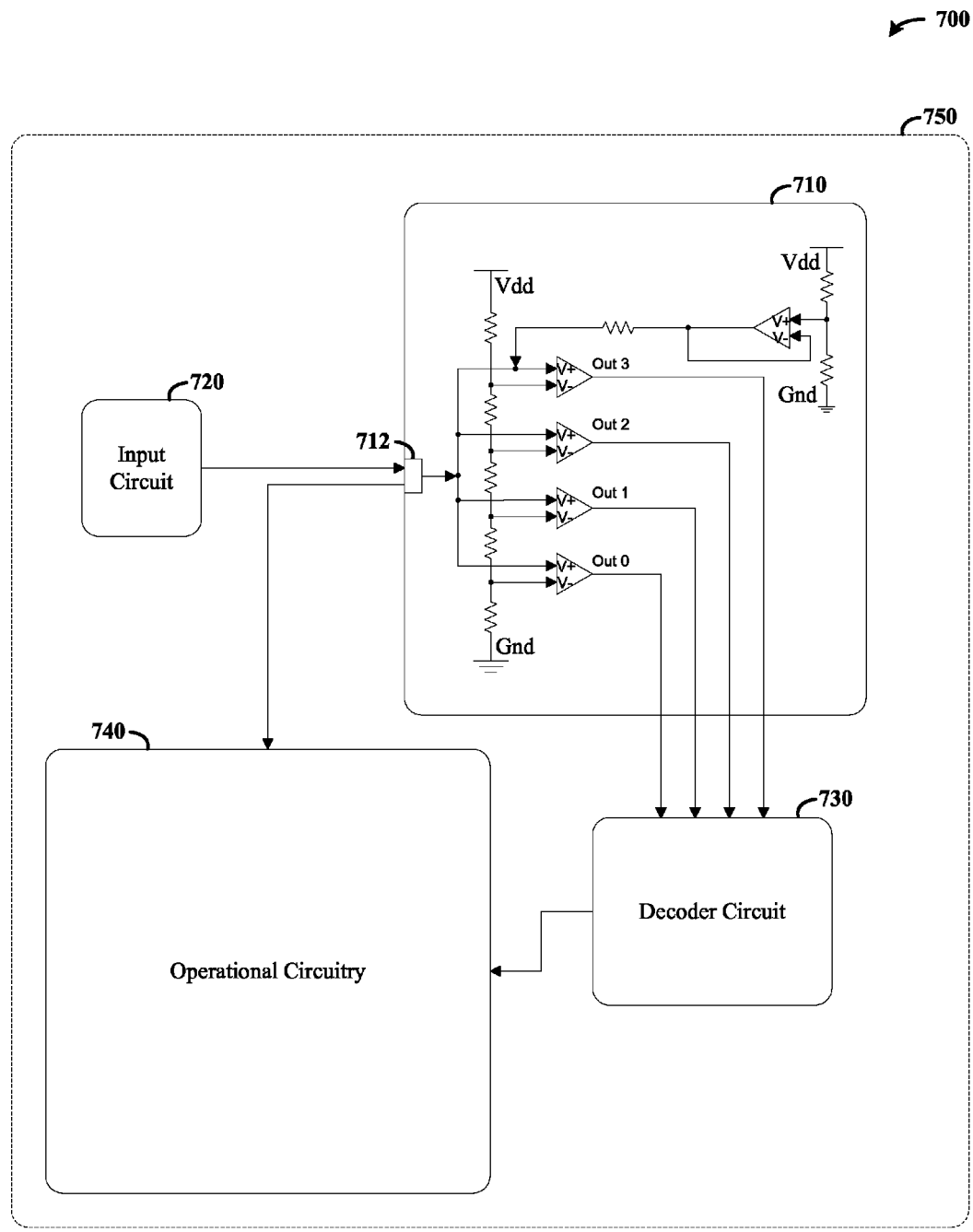
FIG. 7 shows a circuit arrangement including an input circuit, input pin state detection circuit, decoder and operational circuitry, in accordance with other example embodiments of the present invention.

FIG. 7 shows a circuit arrangement 700 including an input state detection circuit 710 coupled at a single input pin 712 to an input circuit 720 (or selectively to a plurality of such circuits), in accordance with other example embodiments of the present invention. The circuit arrangement 700 further includes a decoder circuit 730 and operational circuitry 740 (e.g., one or more circuits that operate with the input circuit 720). The respective state detection circuit 710, input circuit 720, decoder circuit 730 and operational circuitry 740 may be implemented in one or more common circuits, with an integrated circuit chip 750 shown by way of example.

As discussed above, the decoder circuit 730 may be integrated with the state detection circuit 710. The decoder circuit 730 is coupled to receive the outputs of comparators in the state detection circuit 710, and to use outputs to determine the type of the input circuit 720. For example, where the state detection circuit 710 is used to detect the connectivity of input circuits as shown in FIGS. 2-6, the outputs can be analyzed in a manner commensurate with the approach shown in and described in connection with Table 1. This determined type is then used, directly by the decoder circuit and/or by other circuitry (740) to control one or more of the connectivity and/or implementation of the input circuit 720.

Figure 8:
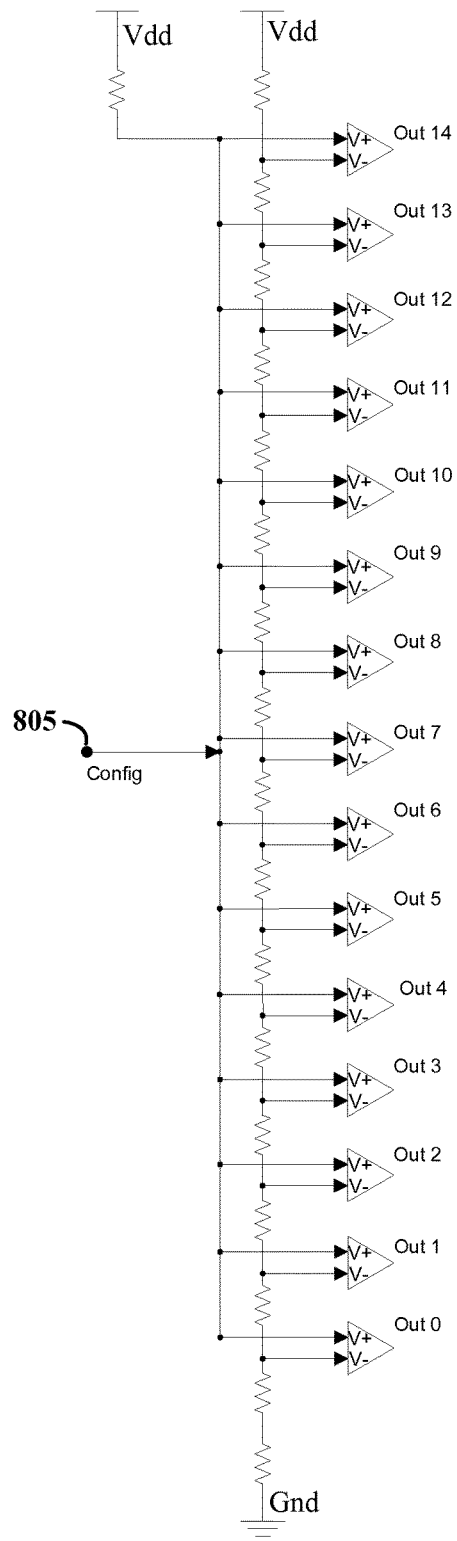
FIG. 8 shows a 16 state per pin input circuit, in accordance another example embodiment of the present invention.

As discussed above, various numbers of comparators can be used for detecting different combinations of states available at an input pin (or pins). FIG. 8 shows another such approach, similar to that shown in FIG. 1, involving a circuit 800 that is configured to provide 16-state per pin detection, in accordance with various embodiments. An input signal received at an input pin 805 is used via comparator/outputs 0-14 to provide 16 states as follows in Table 3:

TABLE 3

16-State Input Table

| Input R to gnd | Output | | | | | | | | | | | | | | | State |
|---|---|---|---|---|---|---|---|---|---|---|---|---|---|---|---|---|
| | 14 | 13 | 12 | 11 | 10 | 9 | 8 | 7 | 6 | 5 | 4 | 3 | 2 | 1 | 0 | |
| 0 | 0 | 0 | 0 | 0 | 0 | 0 | 0 | 0 | 0 | 0 | 0 | 0 | 0 | 0 | 0 | 0 |
| 5k | 0 | 0 | 0 | 0 | 0 | 0 | 0 | 0 | 0 | 0 | 0 | 0 | 0 | 0 | 1 | 1 |
| 10k | 0 | 0 | 0 | 0 | 0 | 0 | 0 | 0 | 0 | 0 | 0 | 0 | 0 | 1 | 1 | 2 |
| 15k | 0 | 0 | 0 | 0 | 0 | 0 | 0 | 0 | 0 | 0 | 0 | 0 | 1 | 1 | 1 | 3 |
| 20k | 0 | 0 | 0 | 0 | 0 | 0 | 0 | 0 | 0 | 0 | 0 | 1 | 1 | 1 | 1 | 4 |
| 25k | 0 | 0 | 0 | 0 | 0 | 0 | 0 | 0 | 0 | 0 | 1 | 1 | 1 | 1 | 1 | 5 |
| 30k | 0 | 0 | 0 | 0 | 0 | 0 | 0 | 0 | 0 | 1 | 1 | 1 | 1 | 1 | 1 | 6 |
| 35k | 0 | 0 | 0 | 0 | 0 | 0 | 0 | 0 | 1 | 1 | 1 | 1 | 1 | 1 | 1 | 7 |
| 40k | 0 | 0 | 0 | 0 | 0 | 0 | 0 | 1 | 1 | 1 | 1 | 1 | 1 | 1 | 1 | 8 |
| 45k | 0 | 0 | 0 | 0 | 0 | 0 | 1 | 1 | 1 | 1 | 1 | 1 | 1 | 1 | 1 | 9 |
| 50k | 0 | 0 | 0 | 0 | 0 | 1 | 1 | 1 | 1 | 1 | 1 | 1 | 1 | 1 | 1 | 10 |
| 55k | 0 | 0 | 0 | 0 | 1 | 1 | 1 | 1 | 1 | 1 | 1 | 1 | 1 | 1 | 1 | 11 |

TABLE 3-continued

16-State Input Table

| Input R to gnd | \multicolumn{15}{c}{Output} | State |
| --- | --- | --- | --- | --- | --- | --- | --- | --- | --- | --- | --- | --- | --- | --- | --- | --- |
| | 14 | 13 | 12 | 11 | 10 | 9 | 8 | 7 | 6 | 5 | 4 | 3 | 2 | 1 | 0 | |
| 60k | 0 | 0 | 0 | 1 | 1 | 1 | 1 | 1 | 1 | 1 | 1 | 1 | 1 | 1 | 1 | 12 |
| 65k | 0 | 0 | 1 | 1 | 1 | 1 | 1 | 1 | 1 | 1 | 1 | 1 | 1 | 1 | 1 | 13 |
| 70k | 0 | 1 | 1 | 1 | 1 | 1 | 1 | 1 | 1 | 1 | 1 | 1 | 1 | 1 | 1 | 14 |
| >75k | 1 | 1 | 1 | 1 | 1 | 1 | 1 | 1 | 1 | 1 | 1 | 1 | 1 | 1 | 1 | 15 |

The resistance value (to ground) is set based upon a normalized resistance used in the respective resistors as shown, with the values shown in Table 3 being exemplary. Different embodiments thus involve variations of these configurations, such as may be effected in accordance with Table 2 above.

Figure 9:
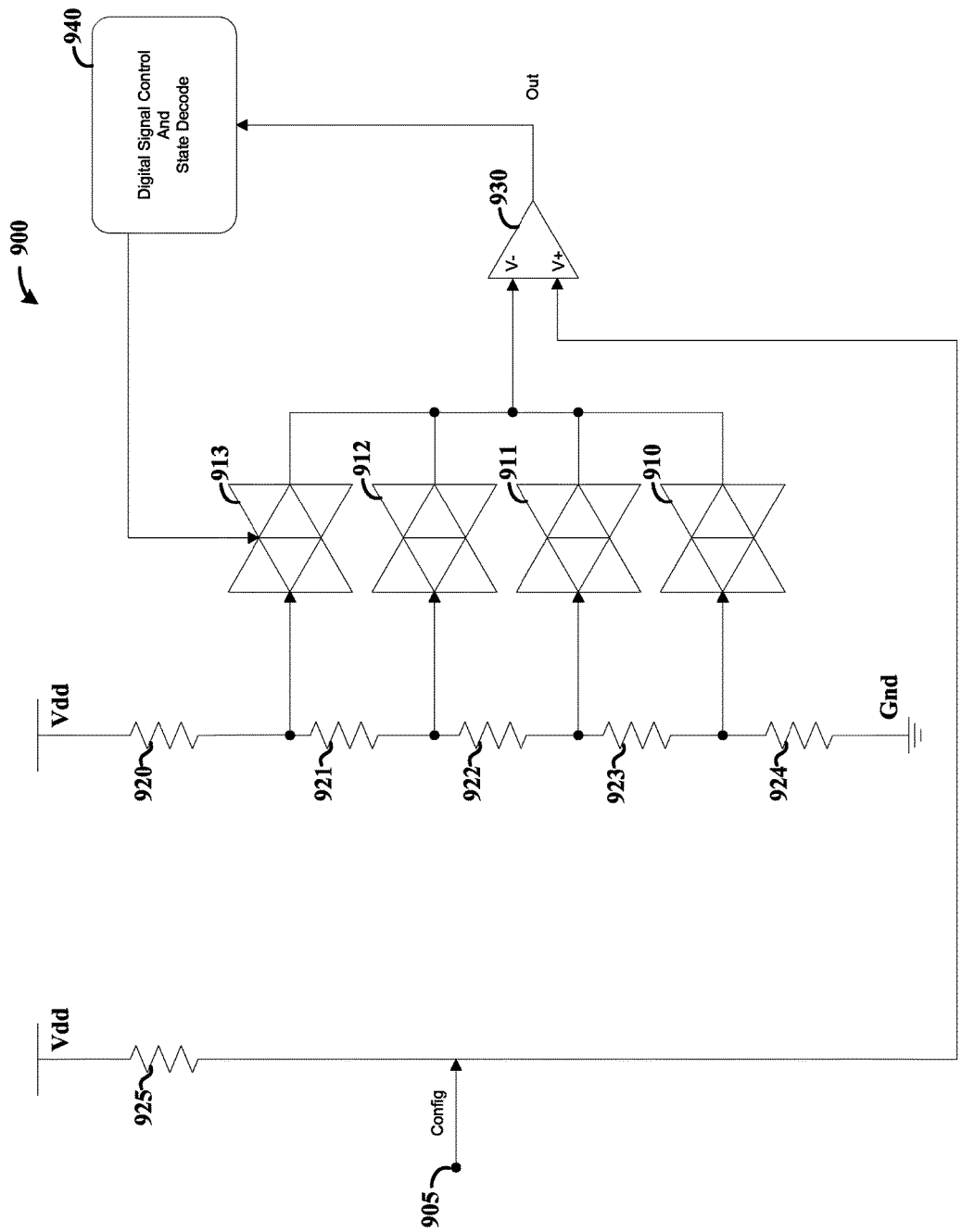
FIG. 9 shows an input pin state detection circuit having a plurality of pass gates feeding a comparator circuit, in accordance with another example embodiment of the present invention.

FIG. 9 shows an input pin state detection circuit 900 having a plurality of pass gates feeding a comparator circuit, in accordance with another example embodiment of the present invention. The circuit 900 includes an input pin 905 that receives an incoming signal, such as shown in FIGS. 2-6. A plurality of pass gates 910-913 are connected between Vdd and ground via resistors 920-924, and respectively connected to the low input of a comparator 930. The high input of the comparator 930 is connected to Vdd via resistor 925, with the input pin 905 being between the high input and the resistor.

A digital signal control/state decode circuit 940 is configured to control the pass gates 910 and 913, and further to receive and decode the output of the comparator 930 for detecting the state at the input pin 905. In some embodiments, the digital signal control and state decode functions carried out at circuit 940 are carried out using separate circuits. By controlling the pass gates 910-913, the low input of the comparator 930 can be coupled as desired between the resistors 920-924, which can be effected in a manner similar to that shown in FIG. 1, to a similar effect with fewer comparators. Accordingly, the circuit 900 can be implemented, for example, in connection with one or more of the circuits shown in FIGS. 1, 7 and 8, with the combined pass gate and comparators used to reduce the number of comparators needed.

Based upon the above discussion and illustrations, those skilled in the art will readily recognize that various modifications and changes may be made to the present invention without strictly following the exemplary embodiments and applications illustrated and described herein. For example, the input terminals as shown and discussed may be replaced with terminals of different arrangements, and different types and numbers of input configurations (e.g., involving different types of input circuits and related connectivity). In addition, resistors of various values may be used in the input state detection circuits as shown and described, together with different values of Vdd, as relative to other resistors in the circuit and/or of the input circuits of which the resulting input pin state is to be evaluated. Such modifications do not depart from the true spirit and scope of the present invention, including that set forth in the following claims.

What is claimed is:

1. An apparatus comprising:
a divider circuit configured and arranged with nodes between respective resistors, the nodes respectively providing access to resistance-based voltage values;
an input port configured and arranged to receive an input signal provided by one of a plurality of different types of input circuits;
a first circuit configured and arranged to provide a binary output signal based on the state of the input signal and the resistance-based voltage values, the binary output signal including a combination of individual output values in which each output value is based on the input signal and one of the resistance-based voltage values;
wherein the binary output signal is further based on a negative-feedback operational amplifier having an output connected to the input port, a high-level input connected to a feedback power source, a low-level input, and a feedback circuit connecting the output to the low-level input;
a second circuit configured and arranged to decode the binary output signal and use the decoded output signal to determine the state of the input signal and the type of the input circuit from which the input signal is received; and
a control circuit configured and arranged to,
power-on a state-detection circuit upon a startup condition, and
for the input signal, power-off the state-detection circuit in response to a decoder circuit determining the state of the input signal, and configure the apparatus for operation based upon the determined state of the input signal.

2. The apparatus of claim 1, wherein
the binary output signal for each of the different types of input circuits is exclusive to the type of input circuit from which the input signal is provided, and
the first circuit is configured and arranged to provide an exclusive one of the binary output signals for each of N different types of the input circuits, in which N is an integer greater than two.

3. The apparatus of claim 1,
wherein the first circuit includes, for each of the nodes in the divider circuit, a comparator having a first input connected to the node and a second input connected to an input via which the input signal is provided, the comparator being configured and arranged to output one of the individual output values.

4. The apparatus of claim 1,
wherein the first circuit is configured and arranged to provide the output signal as a combination of individual binary values, each individual binary value being based on a comparison of the input signal and one of the resistance-based voltage values.

5. The apparatus of claim 1, wherein the first circuit includes:
a switch circuit connected to at least two of the nodes in the divider circuit and configured and arranged to provide a switched output corresponding to one of the at least two nodes, and a comparator connected to the switch circuit and configured to compare the input signal with the switched output, the first circuit being configured and arranged to provide the binary output signal based on the comparison.

6. The apparatus of claim 1,
wherein the the input port includes a first input pin configured and arranged to receive the input signal, and a second input pin configured and arranged to receive a different input signal, the first circuit being configured and arranged to provide the binary output signal based on the state of the input signal and the different input signal as respectively received on the first and second input pins.

7. The apparatus of claim 1, wherein the first circuit is configured and arranged to provide the binary output signal based on a resistor coupled between an input pin via which the input signal is received, and at least one of a source and ground.

8. An apparatus comprising:
an input pin configured and arranged to receive input signals from a plurality of types of input circuits; and
a plurality of comparator circuits, each comparator circuit having a high-level input directly coupled to the input pin and a low-level input coupled between a first power source and a reference node, different ones of the comparator circuits being connected to different reference nodes that provide different voltage levels, the high-level inputs of the comparator circuits being connected in series, the comparator circuits being configured and arranged with the input pin to identify each of the plurality of types of input circuits by:
providing respective binary outputs of each of the comparator circuits, and
identifying the type of the input circuit connected to the input pin by providing an output based upon the respective binary outputs, the output characterizing a plurality of states of the input pin, each of the plurality of states corresponding to a specific one of the types of the input circuits; and
a negative-feedback operational amplifier having an output connected to the high-level inputs of the comparator circuits, a high-level input connected to a feedback power source, a low-level input, and a feedback circuit connecting the output to the low-level input.

9. The apparatus of claim 8, further including:
a resistor circuit connected in series between a first one of the comparator circuits and the first power source;
for each pair of comparator circuits having respective high-level inputs connected in series, a resistor circuit connected therebetween;
a resistor circuit connected between a last one of the comparator circuits and a reference node;
a resistor circuit connected between the high-level input of the negative-feedback operational amplifier and the feedback power source; and
a resistor circuit connected between the high-level input of the negative-feedback operational amplifier and a feedback reference node.

10. The apparatus of claim 9, further including a decoder circuit coupled to the outputs of the comparator circuits and configured and arranged to detect the state of the input pin based upon the binary outputs of the comparator circuits, and to provide the detected state for operating the input circuit connected to the input pin.

11. The apparatus of claim 8, further including a decoder circuit coupled to the outputs of the comparator circuits and configured and arranged to detect the state of the input pin based upon the binary outputs of the comparator circuits, and to provide the detected state for operating the input circuit connected to the input pin.

12. The apparatus of claim 8, further including a control circuit configured and arranged to:
power on the comparator circuits for an initialization cycle during which the state of the input pin is detected, and
after the state of the input pin has been detected, power off the comparator circuits and operate the input circuit connected to the input pin based on the detected state.

13. The apparatus of claim 8, further including a control circuit configured and arranged to:
during an initialization period, power on the comparator circuits and detect the state of the input pin based upon the binary outputs of the comparator circuits, and
after the initialization period, power off the comparator circuits and provide the detected state for operating an input circuit connected to the input pin.

14. The apparatus of claim 8, further including a control circuit configured and arranged to:
during an initialization period, power on the comparator circuits and detect the state of the input pin based upon the binary outputs of the comparator circuits,
after the initialization period, power off the comparator circuits and operate the input circuit connected to the input pin based on the detected state,
after operating the input circuit, in response to a reset event, re-power the comparator circuits and re-detect the state of the input pin based upon the binary outputs of the comparator circuits, and
after re-detecting the state of the input pin, power off the comparator circuits and operate the input circuit connected to the input pin based on the re-detected state.

15. The apparatus of claim 8,
further including a plurality of resistor circuits connected in series with the high-level inputs of the comparator circuits,
the resistor circuits being configured and arranged with the comparator circuits to set the binary output of each of the comparator circuits to a different value, relative to the other comparator circuits,
therein providing the detection of at least three states respectively corresponding to three different ones of the types of input circuits.

16. A method comprising:
providing a binary output signal based on the state of an input signal provided by one of a plurality of different types of input circuits, the binary output signal including a combination of individual output values in which each output value is based on the input signal and one of a plurality of resistance-based voltage values;
wherein the input signal is received on an input port coupled to a negative-feedback operational amplifier having an output connected to the input port, a high-level input connected to a feedback power source, a low-level input, and a feedback circuit connecting the output to the low-level input; and
wherein the binary output signal is further based on a signal from the negative-feedback operational amplifier;
decoding the binary output signal;
determining the state of the input signal and the type of the input circuit from which the input signal is received based on the decoded output signal, each decoded output signal corresponding to a specific one of the types of input circuits; and for the input signal, configuring circuitry for operation based upon the determined state of the input signal and a corresponding input circuit that provides the input signal.

17. The method of claim 16, wherein the respective steps of providing, decoding, determining and configuring are carried out in response to a startup condition, and the steps are terminated by removing power in response to the state of the input signal being determined.

18. The method of claim 16, wherein determining the state of the input signal includes, at different times and for at least three different types of the input circuits respectively connected to provide respective ones of the input signals, determining respective states that are exclusive for the input signal.

19. The method of claim 16, wherein the binary output signal for each of the different types of input circuits is exclusive to the type of input circuit from which the input signal is provided; and providing the binary output signal includes processing the input signal by using a plurality of comparator circuits and respective resistor circuits between each comparator circuit to set a binary output of each of the comparator circuits to different respective values, and providing the binary output signal based on the binary outputs of each of the comparator circuits.

* * * * *